United States Patent [19]

Potter

[11] Patent Number: 4,794,021
[45] Date of Patent: Dec. 27, 1988

[54] METHOD OF PROVIDING A PLANARIZED POLYMER COATING ON A SUBSTRATE WAFER

[75] Inventor: Curtis N. Potter, Austin, Tex.

[73] Assignee: Microelectronics And Computer Technology Corporation, Austin, Tex.

[21] Appl. No.: 930,166

[22] Filed: Nov. 13, 1986

[51] Int. Cl.$^4$ .............................................. B05D 3/12
[52] U.S. Cl. .................................... 427/240; 427/384; 430/330
[58] Field of Search ..................... 427/240, 82, 384; 430/330

[56] References Cited

U.S. PATENT DOCUMENTS

| | | | |
|---|---|---|---|
| 569,160 | 10/1896 | Ball | 118/500 |
| 4,068,019 | 1/1978 | Bueckl | 427/82 |
| 4,113,492 | 9/1978 | Sato | 427/240 |
| 4,347,302 | 8/1982 | Gotman | 427/240 |
| 4,468,411 | 8/1984 | Sloan | 427/82 |
| 4,510,176 | 4/1985 | Cuthbert | 427/240 |
| 4,518,828 | 5/1985 | Economy | 427/82 |
| 4,562,100 | 12/1985 | Fryd | 427/82 |

FOREIGN PATENT DOCUMENTS 60-226125  11/1985  Japan .................................. 427/240

OTHER PUBLICATIONS

Esch et al, "Rheology Control of Films Deposited by Spin Coating Techniques", IBM TDB vol. 16, No. 6, Nov. 1973.

*Primary Examiner*—Shrive Beck
*Assistant Examiner*—Vi D. Dang
*Attorney, Agent, or Firm*—Fulbright & Jaworski

[57] ABSTRACT

Applying a photoresist layer containing a solvent to the top of an electronic wafer by spin coating. Before the layer dries the wafer is heated in an oven while controlling the solvent loss from the coating by maintaining the pressure of the solvent vapor and providing a slow solvent loss for planarizing the top surface of the polymer. The device is removed from the first oven and the bake cycle is completed in a standard convection bake oven.

8 Claims, 1 Drawing Sheet

METHOD OF PROVIDING A PLANARIZED POLYMER COATING ON A SUBSTRATE WAFER

BACKGROUND OF THE INVENTION

In conventional semi-conductor devices fabrication of thin, usually less than 5 microns thick, photoresist layers are spin coated on wafers sequentially during fabrication steps. The photosensitive resist is exposed through an appropriate mask, developed, then the resulting resist pattern is transferred to a metal layer by etching or plate up.

For some applications it has been found necessary to use resist layers from 5 to 50 microns in thickness, or more. However, as the thickness increases it becomes more difficult to uniformly coat wafers. Thickness variations due to features in relief on the wafer surface and a tendency for the resist to bead to a greater thickness at the edge of the wafer become significant problems.

The present invention is directed to a method of obtaining a thick, uniform photoresist or other polymer coating on a semiconductor or other wafers by means of a novel reflow technique. The present method is particularly useful for planarizing wafers which contain previously fabricated structures in high relief.

SUMMARY

The present invention is directed to a method of providing a uniform thick coating of photoresist or other polymer coating to be formed over large relief features on a semiconductor or other wafers with a greatly reduced edge bead width.

A stil further object of the present invention is the method of providing a planarized coating on an electronic wafer including applying a polymer containing a solvent to the wafer by spin coating, and before the polymer dries, placing the coated wafer in an oven. The wafer is heated while controlling the solvent loss by maintaining the pressure of the solvent vapor and providing a slow solvent loss for planarizing the top surface of the polymer. Thereafter, the wafer is removed from the first oven and the bake cycle is completed in a standard convection bake oven.

The method includes supporting the wafer in the oven on a plurality of small pin points for reducing thermal drain and loss of planarization.

The present invention is further directed to a method of providing a planarized photoresist layer on a semiconductor device including applying photoresist layer containing a solvent to the top of the device by spin coating. Before the layer dries, the device is heated in an oven at approximately 90° C. for about ten minutes in which the oven controls the solvent loss by the pressure of the solvent vapor and provides a slow solvent loss for planarizing the top surface of the resist layer. Thereafter, the device is removed from the first oven and placed in a convection bake oven for completing the bake cycle. In one form of the method, th first oven includes a vent opening for conrrolling the venting of the solvent in which the opening is adjacent the bottom of the opening. However, the first oven can be a closed oven in which the partial solvent pressure is supplied from an external source.

Other and further objects, features and advantages will be apparent from the following description of a presently preferred embodiment of the invention, given for the purpose of disclosure and taken in conjunction with the accompanying drawing.

DESCRIPTION OF THE PREFERRED EMBODIMENT

While the present invention will be described in connection with applying a thick photoresist layer on a semiconductor, for purposes of illustration only, the present method is also useful for providing a planarized coating of other polymers on other electronic wafers.

As has previously been described, in conventional semiconductor devices, a thin, usually less than 5 micron thick, photoresist layers are spin coated onto wafers sequentially during fabrication steps. Thicker coatings are more difficult to apply and still provide a uniform coat. Thickness variations due to features in relief on the wafer surface, and a tendency for the resist to bead to a greater thickness at the edge of the wafer become significant problems.

The present method is particularly useful for coating wafers such as semiconductors with a coating thickness of 5 to 50 microns. The present method has produced a photoresist layer 30 micron thick with thickness variations of plus or minus 2% across 99% of a four inch diameter wafer surface.

EXAMPLE

Figure 1:
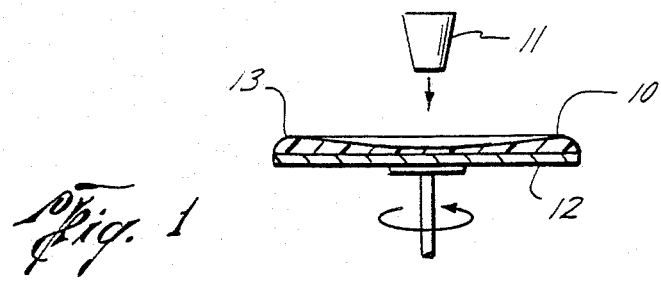
FIG. 1 is an elevational schematic of the spin coating step.
Figure 2:
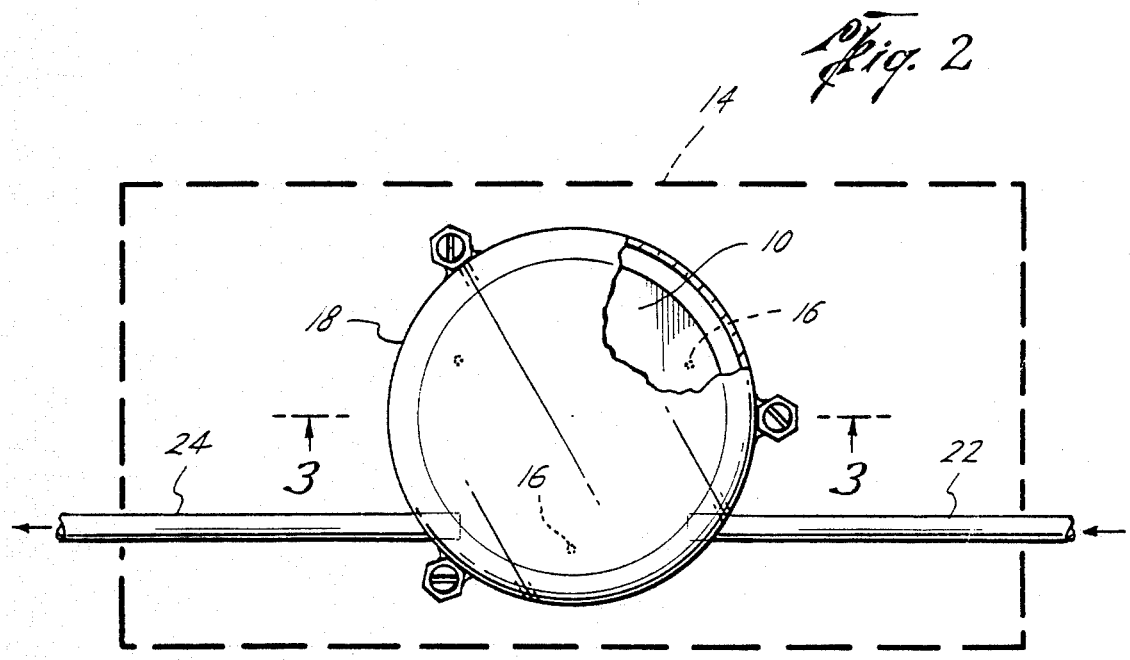
FIG. 2 is an elevational view of a partially closed cover in an oven for providing a planarized surface coating.
Figure 3:
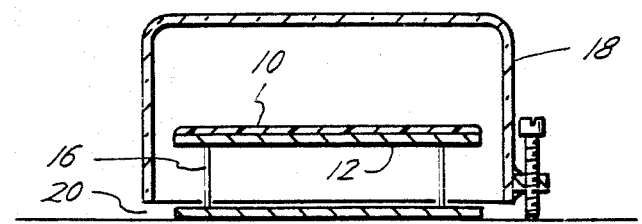
FIG. 3 is a cross-sectional view, taken along the line 3—3 of FIG. 2.

The following method was used for a 26 micron thick positive novalak photoresist coating. First, as best seen in FIG. 1, the photoresist 10 was applied from a container 11 to the top of a wafer 12 by conventional spin coating for five seconds at 1200 rpm to produce a 26 micron thick coating. It is noted that the spin coating creates an enlarged bead 13 at the edge of the wafer 12. Before the resist 10 begins to dry and harden, the wafer 12 is placed in a planarizing oven 14 where the wafer 12 is suspended on pins 16. The wafer 12 is supported in the oven 14 in a glass cover 18 having a vent opening 20, preferably adjacent the bottom of the cover 18. While the oven is shown as enclosing the cover 18, the oven could be heating coils positioned in the cover 18. The temperature is controlled as well as the resist system solvent (such as alcohols, butyl acetate, eylene, polyimide) vapor concentration. Since the resist 10 is in a liquid state during the early part of this treatment the rate of solvent loss is controlled by the partial pressure of solvent vapor above the resist 10 and a slow resist cure results. In this example, the wafer 12 was heated in the oven 14 for approximately ten minutes at 90° C. The volume of the glass cover 18 is 45 cubic inches and the vent opening 20 is 0.093 inches high for satisfactorily controlling the rate of solvent loss from the resist 10. It is to be noted that during the slow resist cure the solvent loss occurs more rapidly from the edge of the wafer 12 causing the edge bead tt the edge of the wafer 12 to become much narrower than is the case with conventional rapid cures. Additionally, the imprint, at the top surface of the resist 10 of large height features in the wafer 12 lying within the resist 10, is minimized, thereby providing good planarization as a result of the slower curing of the resist 10.

There is generally enough solvent within the thick resist 10 to maintain the solvent partial pressure over the wafer 12. This is optimized by adjusting the height of the vent opening 20 around the bottom of the cover 18 versus the volume of the chamber inside of the cover 18.

The pins 16 support the wafer 12 in the oven for suspending the wafer 12 in space for even heating. Furthermore, the support by three small pins limits the thermal drain from the wafer 12 for insuring even drying and maintains planarization. In addition, the points of the pins 16 have a small micron radius which limits imprinting features on the resist 10.

After ten minutes of heating in the oven 14, the wafer 12 is removed from the oven 14 and the bake cycle is completed in a standard convection bake oven at a temperature of 80° C. for thirty minutes.

Also the oven 14 can be a closed system wherein the partial solvent pressure and vent is supplied from an external source. Thus a solvent vapor pressure line 22 and a suction line 24 may be provided connected to the cover 18.

While the above-named method has been described in connection with applying a thick layer of photoresist, it is also applicable to any polymers which have flow and heat curing properties similar to photoresist such as polymide and polysiloxanes.

The present invention, therefore, is well adapted to carry out tee objects and attain the ends and advantages mentioned as well as others inherent therein. While a presently preferred embodiment of the invention has been given for the purpose of disclosure, numerous changes in the details of the steps of the method will be readily apparent to those skilled in the art and which are encompassed within the spirit of the invention and the scope of the appended claims.

What is claimed is:

1. The method of providing a planarized coating on a substrate wafer comprising, applying a polymer of a thickness of greater than 5 microns containing a solvent to the wafer by spin coating, before the polymer dries, placing the coated wafer in an oven having heating means out of direct contact with the wafer, and supporting the coated wafer in the oven from a plurality of pins for allowing the wafer to be evenly heated, heating the wafer while controlling the solvent loss by retaining solvent vapor and maintaining the pressure of the solvent vapor and providing a slow solvent loss for planarizing the top surface of the polymer, and placing the wafer in a bake oven for completing the bake cycle.

2. The method of claim 1 wherein the wafer is supported in the oven on small pin points.

3. The method of claim 1 wherein the thickness of spin coating is greater than 5 microns.

4. The method of providing a planarized photoresist layer on a substrate wafer comprising, applying a photoresist layer of a thickness of greater than 5 microns containing a solvent to the top of the wafer by spin coating, before the layer dries, supporting the wafer from a plurality of pins and heating the wafer in an oven in a vented cover at about 90° C. with heating means out of direct contact with the wafer for about ten minutes in which the oven controls the solvent loss by retaining solvent and maintaining the pressure of the solvent vapor, providing a slow solvent loss for planarizing the top surface of the resist layer, and placing the device in a convection bake oven for completing the bake cycle.

5. The method of claim 4 wherein the vent cover includes, vent opening from the cover adjacent the bottom of the cover.

6. The method of claim 5 wherein the wafer is supported in the oven on small pin points.

7. The method of providing a planarized coating on a substrate wafer comprising, applying a polymer of a thickness of greater than 5 microns containing a solvent to the wafer by spin coating, before the polymer dries, placing the coated wafer in an oven indirectly heating the wafer and supporting the wafer on a plurality of pin points for allowing the wafer to be evenly heated, heating the wafer, controlling the solvent loss by maintaining the pressure while slowly venting the solvent vapor for retaining solvent vapor and providing a slow solvent loss for planarizing the top surface of the polymer, and placing the wafer in a convection bake oven for completing the bake cycle.

8. The method of claim 7 wherein the wafer is spun at approximately 1200 rpm for approximately 5 seconds during the spin coating application.

* * * * *